United States Patent
Soda

(10) Patent No.: US 6,594,331 B1
(45) Date of Patent: Jul. 15, 2003

(54) TWO PHASE DIGITAL PHASE LOCKED LOOP CIRCUIT

(75) Inventor: Masaaki Soda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/564,992

(22) Filed: May 5, 2000

(30) Foreign Application Priority Data

May 11, 1999 (JP) .......................................... 11-130034

(51) Int. Cl.[7] ................................................ H03D 3/26
(52) U.S. Cl. ...................................... 375/376; 375/374
(58) Field of Search .................................. 375/376, 374

(56) References Cited

U.S. PATENT DOCUMENTS

| | | | | |
|---|---|---|---|---|
| 4,535,459 A | * | 8/1985 | Hogge, Jr. ................... | 375/324 |
| 4,975,660 A | * | 12/1990 | Svenson ...................... | 331/1 A |
| 5,027,085 A | * | 6/1991 | Devito ........................ | 331/1 A |
| 5,068,628 A | | 11/1991 | Ghoshal | |
| 5,297,173 A | * | 3/1994 | Hikmet et al. .............. | 375/118 |
| 5,619,171 A | * | 4/1997 | Rijckaert et al. ............ | 331/1 A |
| 5,889,828 A | * | 3/1999 | Miyashita et al. .......... | 375/374 |
| 6,259,755 B1 | * | 7/2001 | O'Sullivan et al. ......... | 375/376 |
| 6,314,151 B1 | | 11/2001 | Fukaishi | |

FOREIGN PATENT DOCUMENTS

| | | | | |
|---|---|---|---|---|
| JP | 57-93748 | 6/1982 | | |
| JP | 62-189847 | 8/1987 | | |
| JP | 2-75241 | 3/1990 | | |
| JP | 8-317005 | 11/1996 | | |
| JP | 10-126400 | * | 5/1998 | ........... H04L/7/033 |
| JP | 11-112335 A | | 4/1999 | |
| JP | 11-112335 | * | 4/1999 | ........... H03L/7/089 |

OTHER PUBLICATIONS

Mehmet Soyuer, "A Monolithic 2.3–Gb/s 100–mW Clock and Data Recovery Circuit in Silicon Bipolar Technology.", IEEE Journal of Solid–State Circuits, vol. 28, No. 12, pp. 1310–1313, 1993.

* cited by examiner

Primary Examiner—Mohammad H. Ghayour
Assistant Examiner—Tony Al-Beshrawi
(74) Attorney, Agent, or Firm—Foley & Lardner

(57) ABSTRACT

To provide a high speed digital PLL circuit which is easily manufactured by IC process. The phase of data signal is locked with a first clock of which frequency is the half of the data signal. Further, a second clock of which phase is shifted by $\pi/2$ compared with the first clock is used for determining phase delay or phase advance of the data signal compared with the first clock. VCO outputs the first clock and the second clock. The phase comparator for inputting the data signal, the first and second clock, outputs a first data sampled at rise up of the first clock, a second data sampled at fall down of the first clock, a first indication signal indicating the phase delay, and a second indication signal indicating the phase advance. The filter for inputting the first and second indication signal outputs a control voltage for VCO.

5 Claims, 8 Drawing Sheets

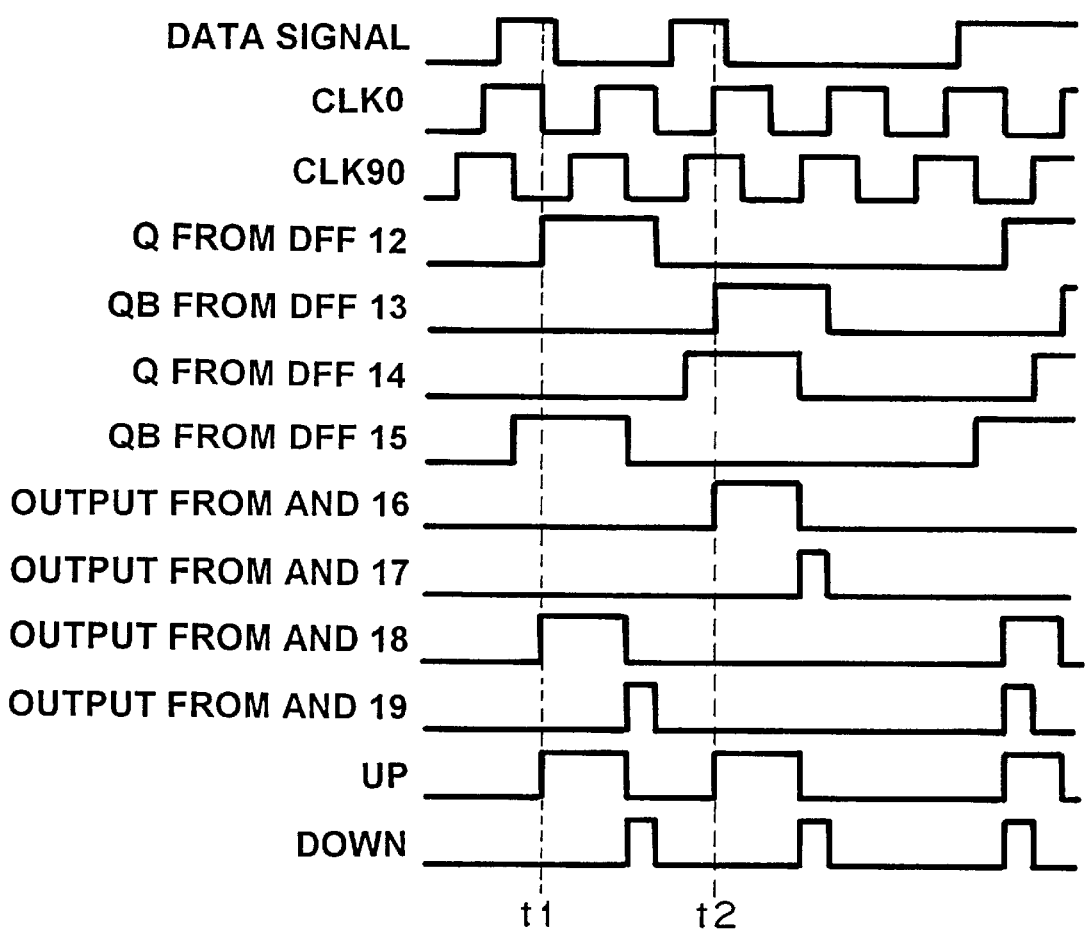

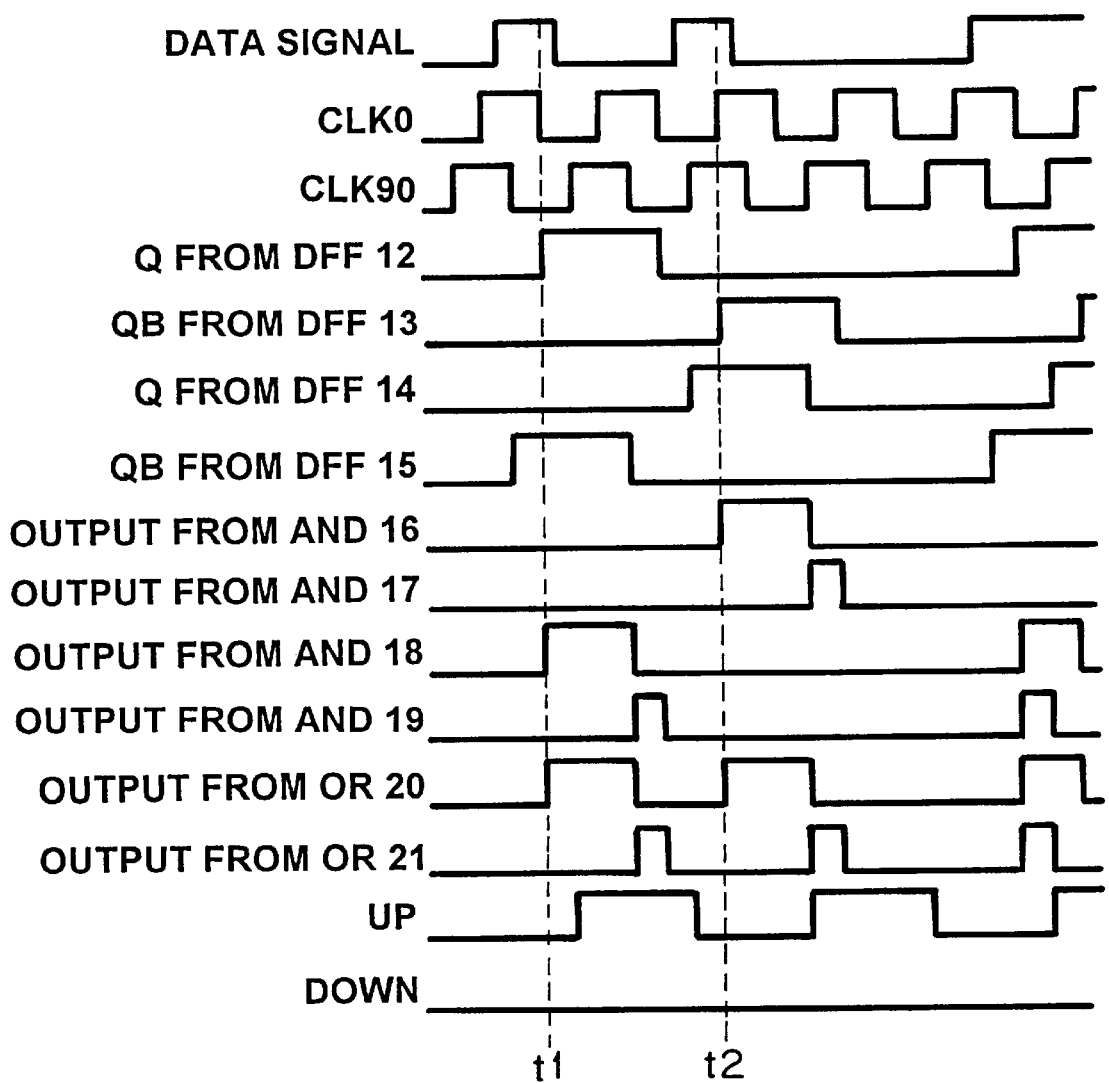

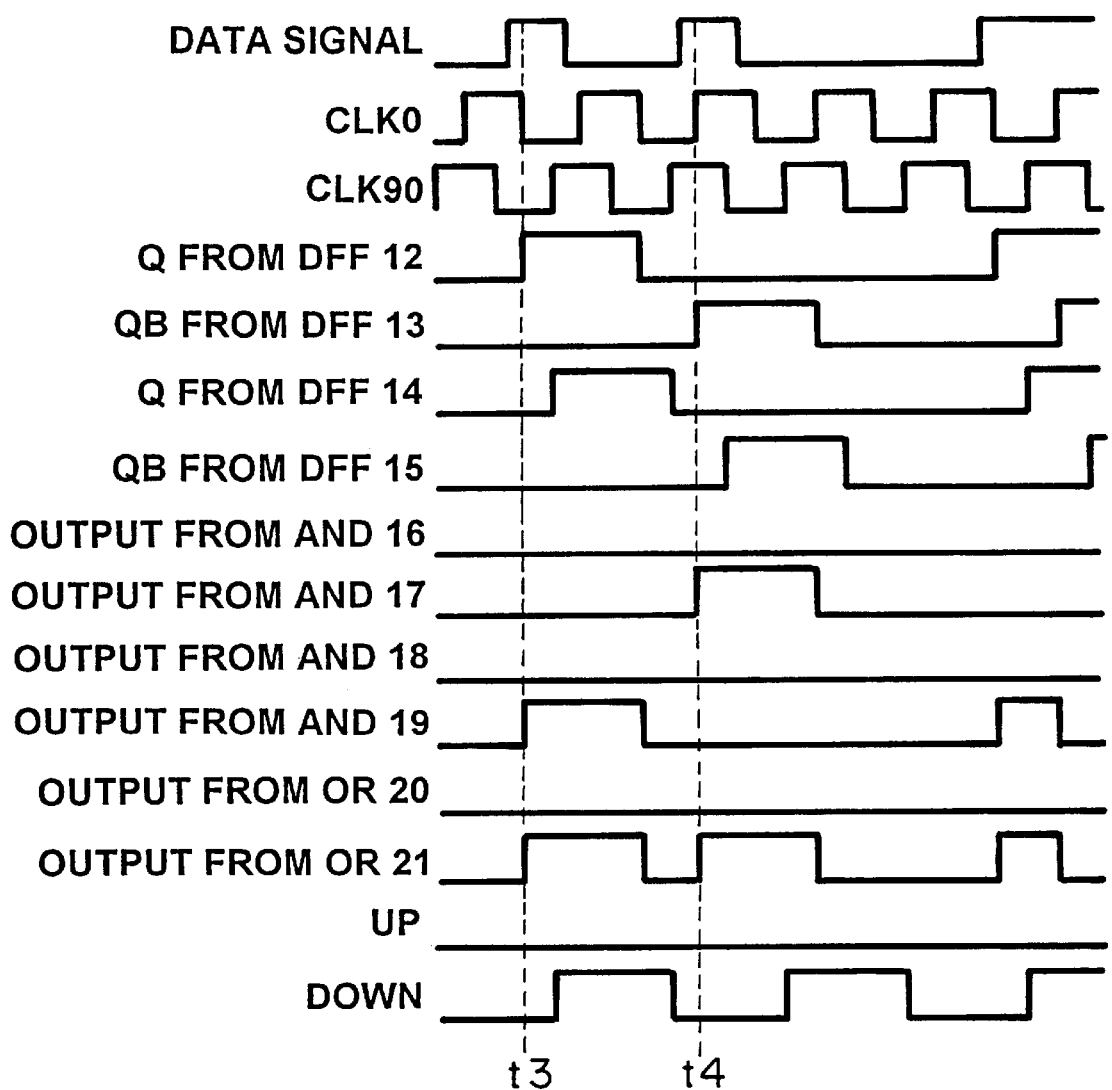

TWO PHASE DIGITAL PHASE LOCKED LOOP CIRCUIT

BACKGROUND OF THE INVENTION

1. Technical Field of the Invention

The present invention relates to a high speed digital phase locked loop (PLL) circuit which is easily manufactured in the form of an integrated circuit (IC).

2. Description of the Prior Art

Recently, various PLL circuits have been developed, because a clock recovery circuit using the PLL circuit is important for providing a small sized apparatus for data transmission.

For example, a PLL circuit of which phase comparator comprises delay flip-flops (DFF) is disclosed in "A Monolithic 2,3-Gb/s 100 mV Clock and Data Recovery Circuit in Silicon Bipolar Technology" IEEE Journal of Solid—State Circuit. VOL.28, NO.12, pp. 1310–1313, December 1993.

A conventional PLL circuit is shown in FIG. 7. The PLL circuit as shown in FIG. 7 comprises phase comparator 50, filter 51, voltage controlled oscillator (VCO) 52, and determination means 53. Further, phase comparator 50 comprises first DFF 54 and second DFF 55.

The clock signal from VCO 52 is sampled by the data signal inputted into first DFF 54 and second DFF 55. Concretely, first DFF 54 samples the clock signal at the rise up of the data signal, while second DFF 55 samples the clock signal at the fall down of the data signal. Therefore, the clock signal is sampled by the two DFFs in turns.

For example, When the data signal is such that "1" follows "0", the phase of the clock signal from VCO 52 is delayed. In this case, the phase of the clock signal is advanced. In other words, the frequency of the clock signal is raised. On the other hand, when the data signal is such that "0" follows "1", the phase of the clock signal from VCO 52 is advanced. In this case, the phase of the clock signal is delayed. In other words, the frequency of the clock signal is lowered. Thus, the data signal is synchronized with the clock signal, because the transition point of the data signal coincides with the fall down point of the clock signal.

By using thus obtained clock signal, the data signal is outputted from determination means 53. The digital circuit by the Si bipolar transistors for determination means 53 can attain higher speed than analog phase comparator.

However, the Si bipolar transistors consume much electric power. The power consumption of CMOS is low, although the speed of CMOS is low in general.

SUMMARY OF THE INVENTION

Therefore, an object of the present invention is to provide a high speed PLL circuit by CMOS for non-return to zero (NRZ) signal.

In the PLL circuit of the present invention, a phase of data signal is locked with a first clock of which frequency is the half of the data signal. Further, a second clock of which phase is shifted by $\pi/2$ compared with the first clock is used for determining phase delay or phase advance of the data signal compared with the first clock.

The PLL circuit of the present invention comprises: a voltage controlled oscillator for outputting the first clock and the second clock; a phase comparator for inputting the data signal, the first clock, and the second clock, and for outputting a first data sampled at fall down of the first clock, a second data sampled at rise up of the first clock, a first indication signal indicating the phase delay, and a second indication signal indicating the phase advance; and a filter for inputting the first indication signal and the second indication signal, and for outputting a control voltage which controls the phase of the first clock outputted from the voltage controlled oscillator.

The phase comparator comprises a data sampling circuit and a phase determination circuit.

The data sampling circuit comprises a first determination means for outputting the first data, a second determination means for outputting the second data, a first delay flip-flop (DFF), and a second DFF, wherein: the data signal and an inverted signal of sad first clock are inputted into the first determination means; the data signal and the first clock are inputted into the second determination means; the data signal and the second clock are inputted into the first DFF; and the data signal and an inverted signal of the second clock are inputted into the second DFF.

The phase determination circuit comprises a first AND circuit, a second AND circuit, a third AND circuit, a fourth AND circuit, a first OR circuit for outputting the first indication signal, and a second OR circuit for outputting the second indication signal, wherein: the inverted logic output from the first determination means, the positive logic output from the second determination means, and the positive logic output from aid first DFF are inputted into the first AND circuit; the inverted logic output from the first determination means, the positive logic output from the second determination means, and the inverted logic output from the first DFF are inputted into the second AND circuit; the positive logic output from the first determination means, the inverted logic output from the second determination means, and the positive logic output from the second DFF are inputted into the third AND circuit; the positive logic output from the first determination means, the inverted logic output from the second determination means, and the inverted logic output from the second DFF are inputted into the fourth AND circuit; the output from the first AND circuit and the output from the third AND circuit is inputted into the first OR circuit; and the output from the second AND circuit and the output from the fourth AND circuit is inputted into the first OR circuit.

Further, the phase determination circuit may comprise a third DFF for sampling the first indication signal and a fourth DFF for sampling the second indication signal, wherein: the output from the first OR circuit and the second clock are inputted into the third DFF; and the output from the second OR circuit and the second clock are inputted into the fourth DFF.

Further, the first and second determination means may be delay flip-flops.

Further, the first and second determination means may comprise, respectively, a first latch circuit for inputting the data signal, a second latch circuit for inputting the output from the first latch circuit, and a third latch for inputting the output from the second latch circuit.

In the above-mentioned first determination means, the first clock is inputted into the clock terminals of the first and third latch circuits; the inverted signal of the first clock is inputted into the clock terminal of the second latch; the output from the second latch circuit is the positive logic output, and the output from the third latch circuit is the inverted logic output.

On the other hand, in the above-mentioned second determination means, the inverted first clock is inputted into the clock terminals of the first and third latch circuits; the inverted signal of the inverted first clock is inputted into the clock terminal of the second latch; the output from the second latch circuit is the positive logic output, and the output from the third latch circuit is the inverted logic output.

The positive logic output from the third latch circuit in the first determination means is outputted from the data sampling circuit, while the positive logic output from the third latch circuit in the second determination means is outputted as the second data from the data sampling circuit.

In the PLL circuit of the present invention, the first clock signal CLK0 of which frequency is the half of the bit rate of the data signal is synchronized with the data signal. Further, the data signal is sampled at the fall down and rise up of the clock. The first clock CLK0 for data separation is not sufficient for determining whether the phase of CLK0 is delayed or advanced. Therefore, the second clock CLK90 of which phase is shifted by $\pi/2$ compared with CLK0 is employed.

The inputted data signal is sampled at the four points; both edges of CLK0 and CLK90, and the phases are compared, by using three edges; two edges of CLK0 and one edge of CLK90 which is in between the two edges of CLK0. Here, sampling points are provisionally assumed to be $t_a$, $t_b$, $t_c$ from past toward present in time order, and $s_a$, $s_b$, $s_c$ are the data signal sampled at the times $t_a$, $t_b$, $t_c$. Therefore, $s_a$ and $s_c$ are sampled by CLK0, while $s_b$ is sampled by CLK90.

The phase of CLK0 is determined to be advanced, when $s_a$ is the same as $s_b$, and is different from $s_c$. In this case, the DOWN signal is generated. On the other hand, the phase of CLK0 is determined to be delayed, when $s_b$ is the same as $s_c$.

A voltage is generated by the filter on the basis of the UP or DOWN signal is fed back into VCO for generating CLK0 and CLK90 of which frequency is the half of the bit rate of the data signal. Therefore, the PLL circuit of the present invention can deal with high bit rate data. The PLL circuit of the present invention can be small in size, because the determination means in the data sampling circuit can be used also for separating inputted data signal.

Concretely, the CMOS PLL circuit of the present invention operated at high speed for the input signal up to 2.4 Gb/s.

Particularly, according to the second embodiment, the convergent time of the PLL circuit was shortened, because the gain of the phase comparator is higher than that of the phase comparator in the first embodiment.

Further, particularly according to the third embodiment, the operation speed became 1.5 times of that in the second embodiment.

BRIEF EXPLANATION OF THE DRAWINGS

FIG. 3A is a timing chart in the phase comparator as shown in FIG. 2, when the clock is delayed, compared with the inputted data signal.

FIG. 5A is a timing chart in the phase comparator as shown in FIG. 4, when the clock is delayed, compared with the inputted data signal.

FIG. 5B is a timing chart in the phase comparator as shown in FIG. 4, when the clock is advanced, compared with the inputted data signal.

PREFERRED EMBODIMENT OF THE INVENTION

Figure 1:
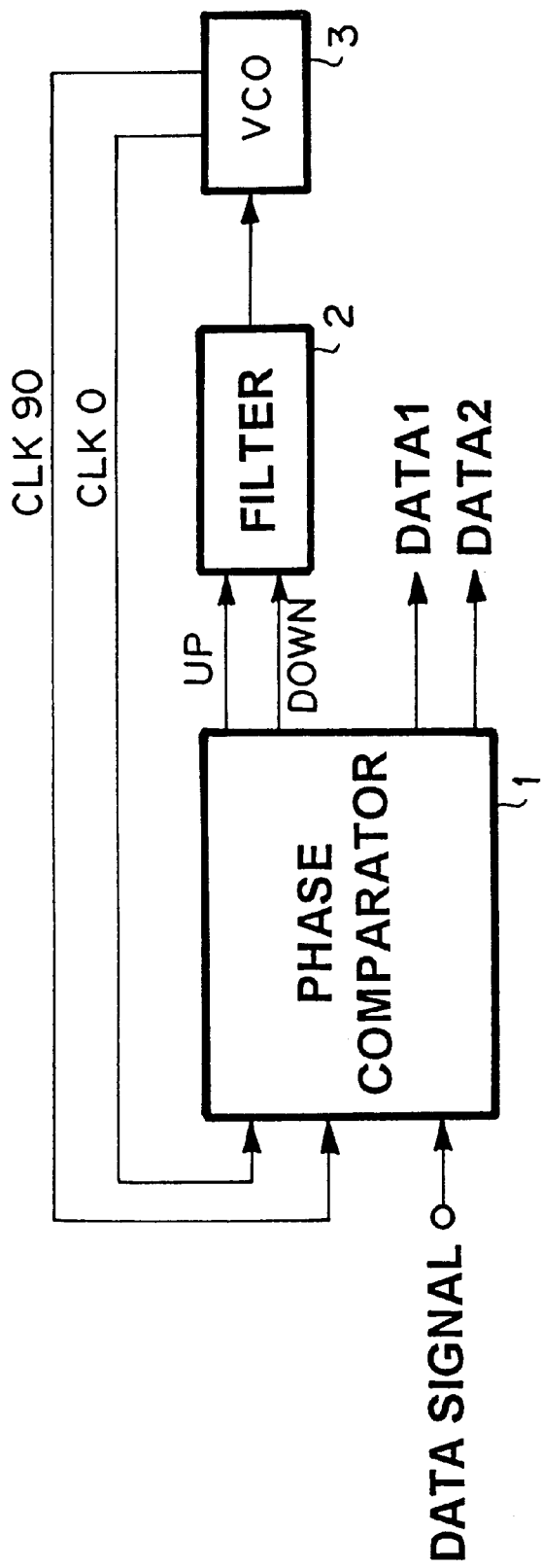
FIG. 1 is a block diagram of the PLL circuit of the first embodiment of the present invention.

The first embodiment is shown in FIG. 1.

The inputs into phase comparator 1 are NRZ data signal, clock signal CLK0 of which frequency is a half of that of the NRZ data signal, and CLK90 of which phase is shifted by $\pi/2$, compared with CLK0. Here, CLK0 and CLK90 are outputted from VCO 3.

Phase comparator 1 outputs UP signal, when the clocks are delayed, compared with the NRZ data signal, while it outputs DOWN signal, when the clocks are advanced, compared with the NRZ data signal.

Filter 2 outputs a control voltage for raising the frequency of VCO 3 on the basis of the UP signal, while it outputs a control voltage for lowering the frequency of VCO 3.

VCO 3 outputs CLK0 and CLK90 on the basis of the output from filter 2.

Figure 2:
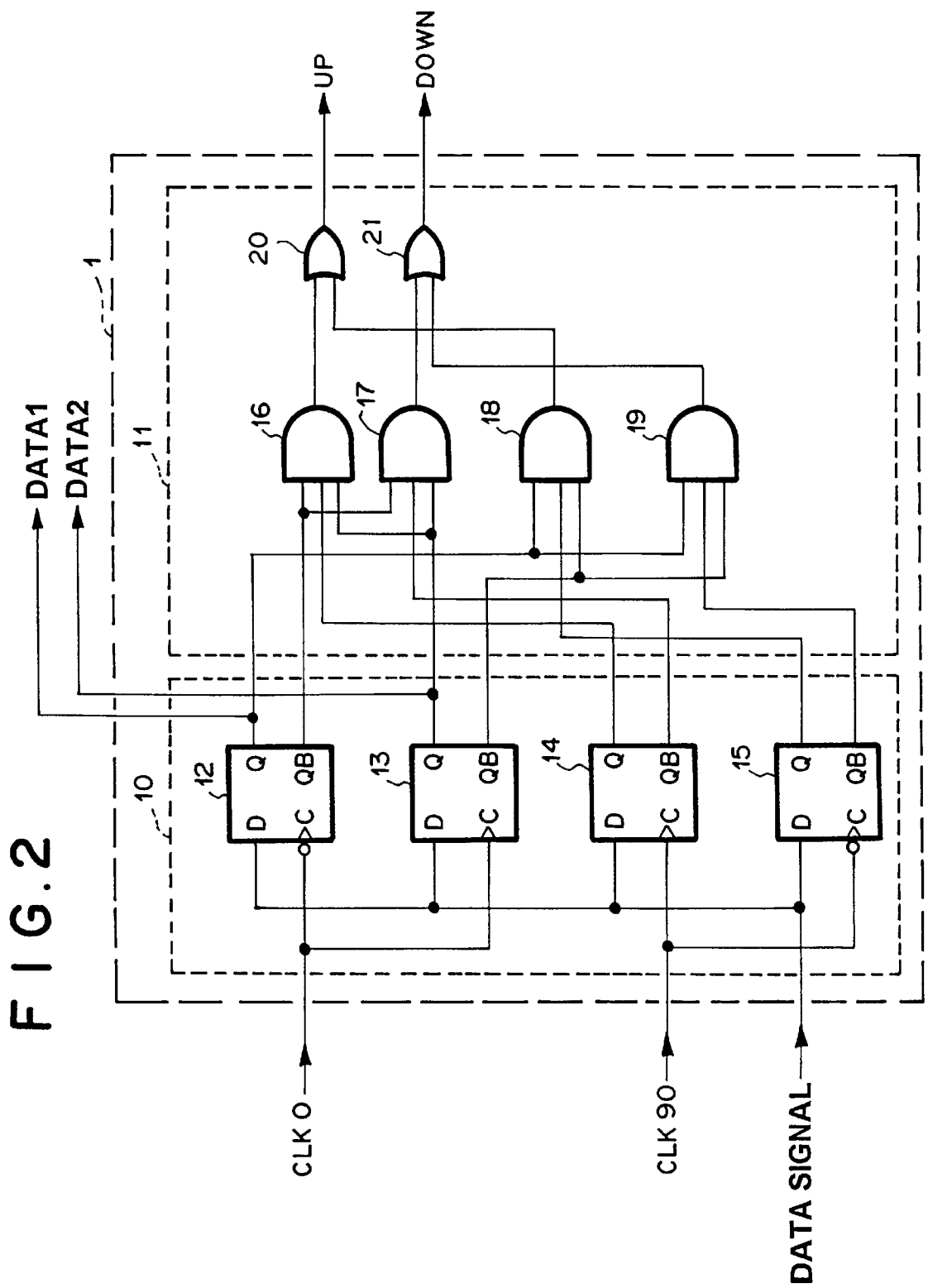
FIG. 2 is a block diagram of the phase comparator of the PLL circuit as shown in FIG. 1.

Phase comparator 1 as shown in FIG. 2 comprises sampling circuit 10, up down signal output circuit 11. Here, sampling circuit 10 comprises first determination means 12, second determination means 13, first DFF 14, and second DFF 15.

Further, in the first embodiment, first and second determination means 12 and 13 are DFFs same as DFFs 14 and 15. The NRZ data signal is inputted into the data input terminals of these four DFFs 12, 13, 14, and 15. CLK0 is inputted into the clock input terminals of DFFs (determination means) 12 and 13. Determination means 12 samples the data signal at the fall down of the clock, while determination means 13 samples the data signal at the rise up of the clock. Further, CLK90 is inputted into the clock input terminals of DFFs (first and second DFFs) 14 and 15. First DFF 14 samples the data signal at the rise up of the clock, while second DFF 15 samples the data signal at the fall down of the clock. The output from first determination means 12 is data1, while the output from second determination means 13 is data2.

UP down signal output circuit 11 comprises first to fourth AND circuits 16 to 19, and first and second OR circuits 20 and 21. The Q terminal output of first determination means 12 is inputted into third and fourth AND circuits 18 and 19, while the QB (Q inverted) terminal output of first determination means 12 is inputted into first and second AND circuits 16 and 17. The QB (Q inverted) terminal output of second determination means 13 is inputted into third and fourth AND circuits 18 and 19.

Further, the Q terminal output of first DFF 14 is inputted into first AND circuit 16, while the QB (Q inverted) terminal output of first DFF 14 is inputted into second AND circuit 17. Further, the Q terminal output of second DFF 15 is inputted into third AND circuit 18, while the QB (Q inverted) terminal output of second DFF 15 is inputted into fourth AND circuit 19.

The outputs from first and third AND circuits are inputted into first OR circuit20, while the outputs from second and fourth AND circuits are inputted into second OR circuit 21. The output terminal of first OR circuit 20 is a terminal for the UP signal, while the output terminal of second OR circuit 21 is a terminal for DOWN signal.

Figure 3B:
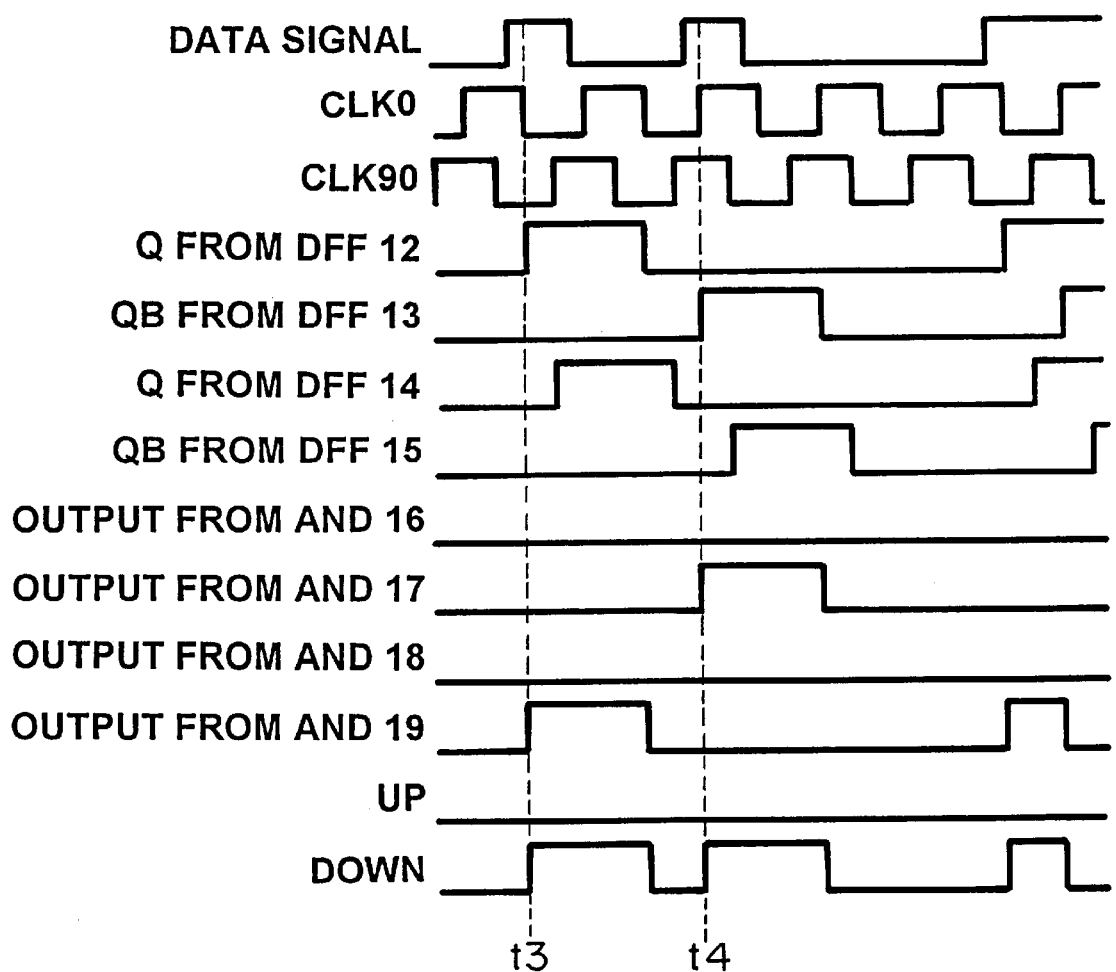
FIG. 3B is a timing chart in the phase comparator as shown in FIG. 2, when the clock is advanced, compared with the inputted data signal.

A timing chart is shown in FIGS. 3A and 3B, for explaining the operation of phase comparator 1. The clock signal is delayed, compared with the data signal in FIG. 3A, while the clock signal is advanced, compared with the data signal in FIG. 3B. The data signal outputted from first determination means 12 is sampled at the fall down of CLK0, while the data signal outputted from second determination means 13 is sampled at the rise up of CLK0. The data signal a outputted from first determination means 12 is sampled at the fall down of CLK0, while the data signal outputted from second determination means 13 is sampled at the rise up of CLK0. The data signal outputted from first DFF 14 is sampled at the rise up of CLK90, while the data signal outputted from second DFF 15 is sampled at the fall down of CLK90.

The output from first determination means 12 changes to "0", at the time $t_1$ as shown in FIG. 3A, after the time when the data signal changes for the first time from "0" to "1". Therefore, the output from third AND circuit 18 becomes "1", because the output Q from first determination means 12 is "1", the output QB (Q inverted) from second determination means 13 becomes "1", and the output Q from second DFF 15 becomes "1". Therefore, the UP signal, or, in other words, the output of first OR circuit 20 becomes "1".

At the time $t_2$ after the time when the data signal changes again from "0" to "1", the output from second determination means 13 and the output from first AND circuit 16 become "1". Therefore, the UP signal, or the output of first OR circuit 20 becomes "1" on the basis of the output "1" from first AND circuit 16. The DOWN signal or the output from second OR circuit 21 becomes "1" during a short period in between the time $t_1$, and $t_2$, because the period for holding the data signal in first determination means 12 is shifted by a half period of the clock, compared with the period for holding the data signal in second determination means 13. This short pulse in the DOWN signal does not have any influence on the synchronization function of PLL circuit of the present invention, although the gain of phase comparator 1 is lowered a little.

In the case as shown in FIG. 3B, wherein the clock signal is advanced, compared with the data signal, the DOWN signal becomes "1" at the timings $t_3$ and $t_4$. Concretely, at the timings $t_3$ and $t_4$, the output from first determination means 12, or second determination means 13 is changed. Then, the output from second AND circuit 17 or fourth AND circuit 19 becomes "1" on the basis of the outputs from first DFF 14 and second DFF 15. Accordingly, the DOWN signal or the output from second OR circuit 21 becomes "1", because one of the input into second OR circuit 21 is "1". The UP signal and DOWN signal from phase comparator for comparing the phases of the data signal and clock signal are fed back to VCO 3 through filter 2, in order to synchronize the data signal with the clock signal.

In short, when the clock signal from VCO 3 is delayed, compared with the data signal, the UP signal "1" from phase comparator 1 is fed into VCO 3 through filter 2, thereby advancing the phase of the clock. The advanced clock is fed back into phase comparator 1. Therefore, the phase of the clock advances gradually due to the feed-back, and coincides with the phase of the data signal at last. On the contrary, when the clock signal from VCO 3 is advanced, compared with the data signal, the UP signal "1" from phase comparator 1 is fed into VCO 3 through filter 2, thereby delaying the phase of the clock. The delayed clock is fed back into phase comparator 1. Therefore, the phase of the clock delays gradually due to the feed-back, and coincides with the phase of the data signal at last. The convergent time of the negative feed-back PLL circuit is in general very small, because phase comparator 1 is a digital circuit, although the convergent time depends upon the time constant of filter 2. Therefore, the synchronized output from VCI 3 is inputted into determination means 1 and 2, and outputted as data 1 and data 2 instantly from first and second determination means, respectively.

As already explained, the clock frequency generated by VCO 3 is the half of the NRZ data signal. For example, the frequency generated by VCO 3 is 500 MHz, when the frequency of the data signal is 1 G bits/s.

Figure 4:
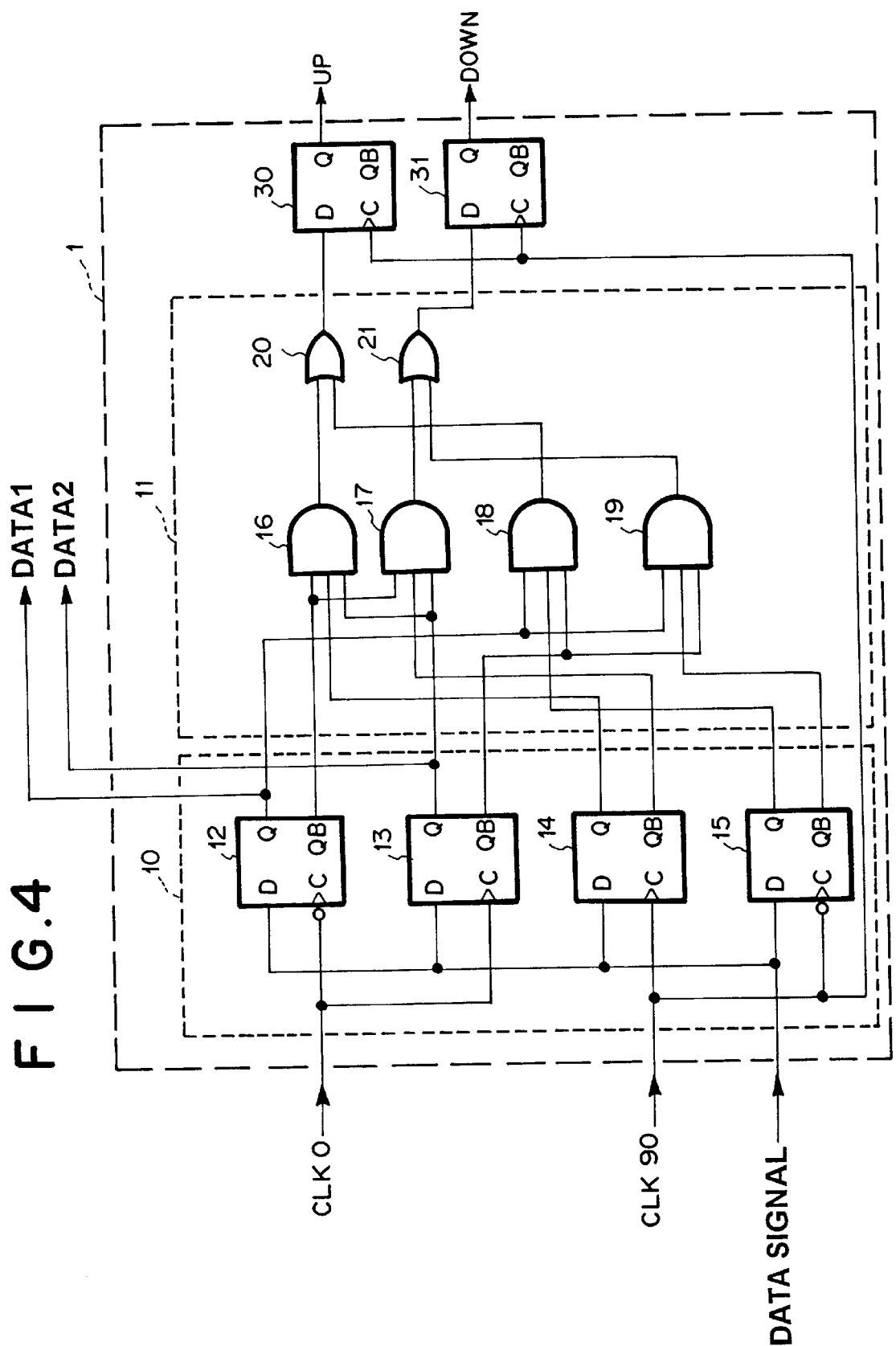
FIG. 4 is a block diagram of the phase comparator in the second embodiment.

Second embodiment is shown in FIG. 4.

Phase comparator 1 comprises sampling circuit 10 and up-down signal output circuit 11, similarly to that as shown in FIG. 2. Further, sampling circuit 10 comprises first and second determination means 12 and 13, respectively, first and second DFFs 14 and 15, respectively. Up down signal output circuit 11 comprises first to fourth AND circuits 16 to 19, respectively, first and second OR circuits 20 and 21, respectively. The operations of sampling circuit 10 and up down signal circuit 11 are the same as those of sampling circuit 10 and up down signal circuit 11 as shown in FIG. 2.

The data input terminal D of third DFF 30 is connected with the output terminal of first OR circuit 20. The data input terminal D of fourth DFF 31 is connected with the output terminal of second OR circuit 21. CLK90 is inputted into the clock input terminal D of third and fourth DFFs 30 and 31, respectively. The UP signal is outputted from the output terminal Q of third DFF 30, while the DOWN signal is outputted from the output terminal Q of fourth DFF 31. Therefore, the UP signal and DOWN signal are sampled by third DFF 30 and fourth DFF 31. Accordingly, the unnecessary short pulse in the DOWN signal following the UP pulse as shown in FIG. 3A is eliminated. Therefore, the convergent time is shortened, because the gain of phase comparator 1 is not lowered.

The timing chart of phase comparator circuit 1 is shown in FIG. 4. The data signal to the output from second OR circuit 21 are the same as those as shown in FIG. 2.

When the clock signal is delayed as shown in FIG. 5A, UP signal pulses are outputted, while any DOWN pulses is not outputted. On the other hand, when the clock signal is advanced as shown in FIG. 5B, DOWN signal pulses are outputted, while any UP pulses is not outputted.

Figure 6:
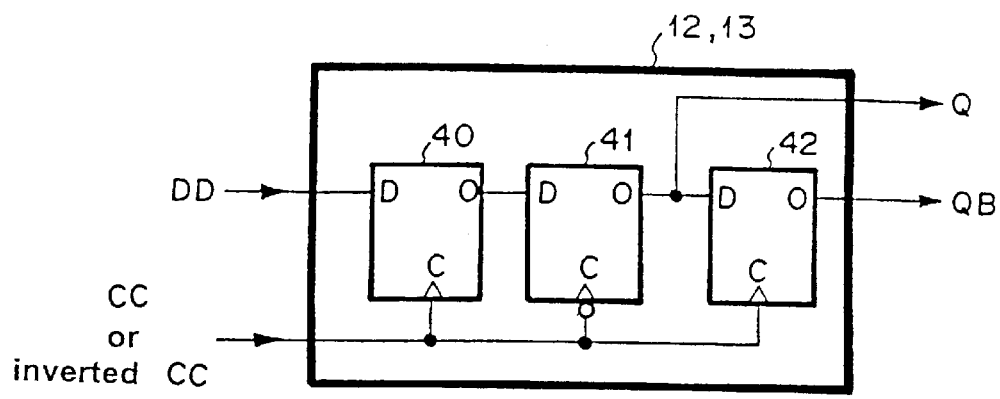
FIG. 6 is a circuit diagram of the determination means in the third embodiment.
Figure 7:
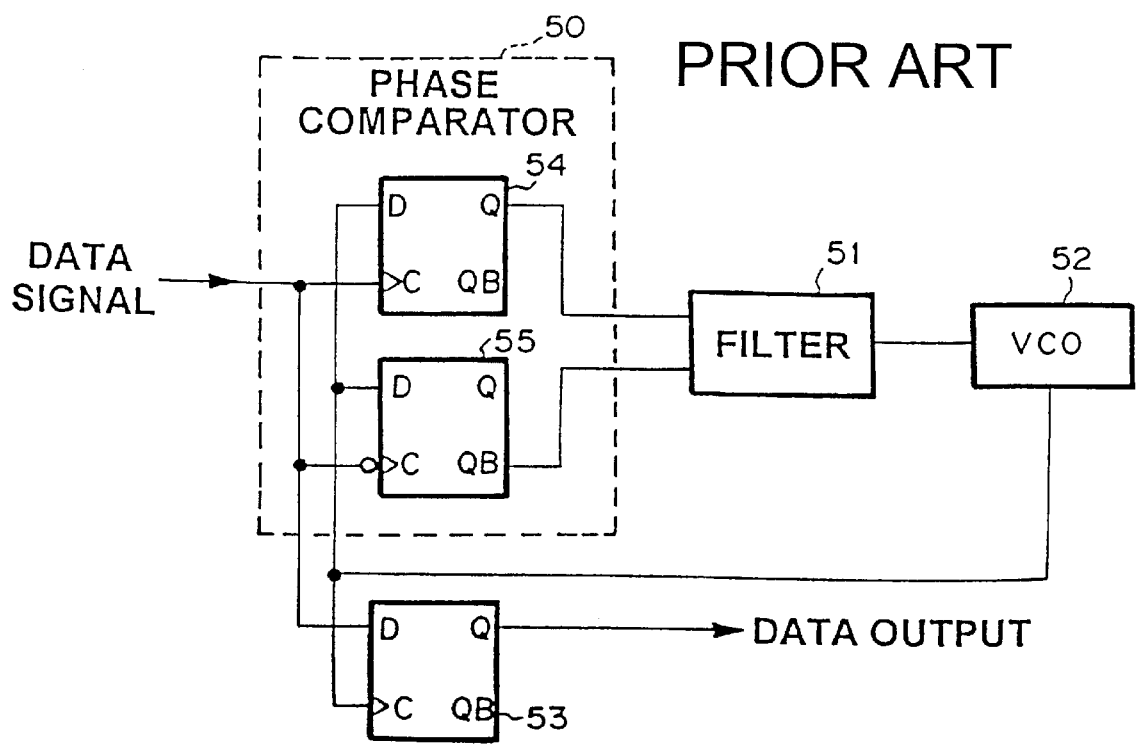
FIG. 7 is a block diagram of a conventional PLL circuit.

Third Embodiment is shown in FIG. 6.

First or second determination means 12 or 13, respectively, in sampling circuit 10 in phase comparator 1 in the third embodiment is shown in FIG. 6. First or second determination means 12 or 13, respectively, comprises first to third latches 40 to 42, respectively.

First to third latch circuits 40 to 42, respectively, latch data DD at the rise up of clock CC, hold the DD during the rise up and fall down of clock CC, and output inverted DD from the terminal O. First or second determination means 12 or 13, respectively, outputs a positive logic output Q from output terminal O of second latch 32, and also outputs an inverted logic output QB from output terminal O of third latch 33.

Determination means 12 latches the data signal at the fall down of the clock, while determination means 13 latches the data signal at the rise up of the clock. Therefore, the output Q from first determination means 12 and the output QB from second determination means 13 are outputted simultaneously, while the output QB from first determination means 12 and the output Q from second determination means 13 are outputted simultaneously.

First AND circuits 16 executes a logic calculation on the basis of the output QB from first determination means 12, the output Q from second determination means 13, and the output Q from first DFF 14 under CLK90, while second AND circuits 17 executes a logic calculation on the basis of the output QB from first determination means 12, and the output Q from second determination means 13, and the output QB from first DFF 14 under CLK90. Therefore, the clock timings of third and fourth DFFs 30 and 31, respectively, as shown in FIG. 4 are easily designed, because the processing times of first and second AND circuits 16 and 17, respectively, becomes long.

What is claimed is:

1. A phase locked loop (PLL) circuit in which a phase of data signal is locked with a first clock of which frequency is the half of said data signal, and a second clock of which phase is shifted by $\pi/2$ compared with said first clock is used for determining phase delay or phase advance of said data signal compared with said first clock, comprising:

a voltage controlled oscillator for outputting said first clock and said second clock;

a phase comparator for inputting said data signal, said first clock, and said second clock, and for outputting a first data sampled at fall down of said first clock, a second data sampled at rise up of said first clock, a first indication signal indicating said phase delay, and a second indication signal indicating said phase advance; and a filter for inputting said first indication signal and said second indication signal, and for outputting a control voltage which controls the phase of said first clock outputted from said voltage controlled oscillator, wherein said phase comparator comprises a data sampling circuit and a phase determination circuit, wherein said data sampling circuit comprises:

a first determination means for outputting said first data, a second determination means for outputting said second data, a first delay flip-flop (DFF), and a second DFF, said data signal and an inverted signal of said first clock being inputted into said first determination means, said data signal and said first clock being inputted into said second determination means, said data signal and said second clock being inputted into said first DFF, and said data signal and an inverted signal of said second clock being inputted into said second DFF, and wherein said phase determination circuit comprises:

a first AND circuit, a second AND circuit, a third AND circuit, a fourth AND circuit, a first OR circuit for outputting said first indication signal, and a second OR circuit for outputting said second indication signal, an inverted signal output from said first determination means, a positive signal output from said second determination means, and a positive signal output from said first DFF being inputted into said first AND circuit, the inverted signal output from said first determination means, the positive signal output from said second determination means, and an inverted signal output from said first DFF being inputted into said second AND circuit, the positive signal output from said first determination means, an inverted signal output from said second determination means, and a positive signal output from said second DFF being inputted into said third AND circuit, the positive signal output from said first determination means, the inverted signal output from said second determination means, and the inverted signal output from said second DFF being inputted into said fourth AND circuit, the output from said first AND circuit and the output from said third AND circuit being inputted into said first OR circuit, and the output from said second AND circuit and the output from said fourth AND circuit being inputted into said first OR circuit.

2. The PLL circuit according to claim 1, wherein said phase determination circuit further comprises a third DFF for sampling said first indication signal and a fourth DFF for sampling said second indication signal, the output from said first OR circuit and said second clock being inputted into said third DFF, and the output from said second OR circuit and said second clock being inputted into said fourth DFF.

3. The PLL circuit according to claim 1, wherein said first and second determination means are DFFs.

4. The PLL circuit according to claim 1, wherein said first determination means in said data sampling circuit comprises a first latch circuit for inputting said data signal, a second latch circuit for inputting the output from said first latch circuit, and a third latch for inputting the output from said second latch circuit, said first clock being inputted into the clock terminals of said first and third latch circuits, the inverted signal of said first clock being inputted into the clock terminal of said second latch circuit, and the output from said second latch circuit being said positive signal output, and the output from said third latch circuit being said inverted signal output.

5. The PLL circuit according to claim 1, wherein said second determination means in said data sampling circuit comprises a first latch circuit for inputting said data signal, a second latch circuit for inputting the output from said first latch circuit, and a third latch for inputting the output from said second latch circuit, the inverted signal of said first clock being inputted into the clock terminals of said first and third latch circuits, the inverted signal of said first clock being inputted into the clock terminal of said second latch circuit, and wherein the output from said second latch circuit is said positive signal output, and the output from said third latch circuit is said inverted logic output.

* * * * *